(12) United States Patent
Li et al.

(10) Patent No.: US 10,462,419 B2
(45) Date of Patent: Oct. 29, 2019

(54) HYBRID SPLITTER PASSING CATV+MOCA AND MOCA SIGNALS

(71) Applicant: CommScope Technologies LLC, Hickory, NC (US)

(72) Inventors: Shi Man Li, Mooresville, NC (US); Mark O. Vogel, Statesville, NC (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/869,184

(22) Filed: Jan. 12, 2018

(65) Prior Publication Data

US 2018/0205910 A1    Jul. 19, 2018

Related U.S. Application Data

(60) Provisional application No. 62/446,323, filed on Jan. 13, 2017.

(51) Int. Cl.
| | |
|---|---|
| *H04N 7/10* | (2006.01) |
| *H03H 7/06* | (2006.01) |
| *H03H 7/48* | (2006.01) |
| *H03H 7/01* | (2006.01) |
| *H04H 20/78* | (2008.01) |
| *H03H 7/46* | (2006.01) |

(52) U.S. Cl.
CPC .............. *H04N 7/104* (2013.01); *H03H 7/06* (2013.01); *H03H 7/1791* (2013.01); *H03H 7/461* (2013.01); *H03H 7/482* (2013.01); *H04H 20/78* (2013.01)

(58) Field of Classification Search
CPC .... H04N 7/102; H04N 7/17309; H04N 7/104; H04N 21/6118; H04L 25/02; H04L 25/00
See application file for complete search history.

(56) References Cited

U.S. PATENT DOCUMENTS

| | | |
|---|---|---|
| 3,676,744 A | 7/1972 | Pennypacker |
| 6,969,278 B2 | 11/2005 | Shapspn |
| 7,530,091 B2 | 5/2009 | Vaughan |
| 8,350,641 B2 | 1/2013 | Alkan et al. |
| 8,695,055 B2 | 4/2014 | Labro |
| 8,752,114 B1 | 6/2014 | Shapson et al. |
| 8,810,334 B2 | 8/2014 | Rijssemus |

(Continued)

FOREIGN PATENT DOCUMENTS

WO    WO2008002086 A1 *    1/2008

*Primary Examiner* — Robert J Hance
*Assistant Examiner* — Anthony Bantamoi
(74) *Attorney, Agent, or Firm* — Muncy, Geissler, Olds & Lowe, P.C.

(57) ABSTRACT

A CATV & MoCA splitter has an input and at least one output that is "CATV & MoCA" and at least one output that is "MoCA only." The splitter functions as a building block to provide a customizable installation that supplies the needed number of "CATV & MoCA" outputs and the needed number of "MoCA only" outputs. The splitter includes a housing with first, second and third coaxial ports attached to the housing. In one embodiment, the second coaxial port is connected to the first coaxial port via a power divider so that all frequencies presented to the first coaxial port can pass to the second coaxial port, and vice versa. A high pass filter, which passes only MoCA signals, connects the power divider and third coaxial port.

20 Claims, 10 Drawing Sheets

(56) References Cited

U.S. PATENT DOCUMENTS

| | | | |
|---|---|---|---|
| 9,209,774 B2 | 12/2015 | Rijssemus | |
| 9,356,796 B2 | 5/2016 | Shapson et al. | |
| 9,699,516 B2 | 7/2017 | Li | |
| 9,743,038 B2 | 8/2017 | Li | |
| 2005/0044573 A1 | 2/2005 | Preschutti | |
| 2006/0205442 A1 | 9/2006 | Phillips et al. | |
| 2009/0320086 A1* | 12/2009 | Rijssemus | H04N 7/17354 |
| | | | 725/127 |
| 2012/0025929 A1 | 2/2012 | Muterspaugh et al. | |
| 2013/0081096 A1 | 3/2013 | Wells et al. | |
| 2013/0128716 A1* | 5/2013 | Reddy | H04J 1/12 |
| 2014/0254441 A1* | 9/2014 | Wang | H04L 5/08 |
| 2015/0207525 A1* | 7/2015 | Li | H04B 1/0057 |
| 2015/0304732 A1* | 10/2015 | Shapson | H04N 21/6168 |
| | | | 725/127 |

* cited by examiner

HYBRID SPLITTER PASSING CATV+MOCA AND MOCA SIGNALS

This application claims the benefit of U.S. Provisional Application Ser. No. 62/446,323, filed Jan. 13, 2017, which is herein incorporated by reference.

BACKGROUND OF THE INVENTION

1. Field of the Invention

The present invention is directed to a splitter that provides at least one "CATV & MoCA" output and at least one "MoCA only" output. More particularly, the present invention relates to low-cost splitter that can function as a building block to provide a customized installation configuration that supplies the needed number of "CATV & MoCA" outputs and the needed number of "MoCA only" outputs for a subscriber's premises.

2. Description of the Related Art

Cable television ("CATV") networks are known types of communications networks that are used to transmit information between a service provider and a plurality of subscriber premises, typically over fiber optic and/or coaxial cables. The service provider may offer, among other things, cable television, broadband Internet and Voice-over-Internet Protocol ("VoIP") digital telephone service to subscribers within a particular geographic area. The service provider transmits "forward path" or "downstream" signals from the headend facilities of the cable television network to the subscriber premises. "Reverse path" or "upstream" signals may also be transmitted from the individual subscriber premises back to the headend facilities. In the United States, the forward path signals are typically transmitted in the 54-1,002 MHz frequency band, and may include, for example, different tiers of cable television channels, movies on demand, digital telephone and/or Internet service, and other broadcast or point-to-point offerings. The reverse path signals are typically transmitted in the 5-42 MHz frequency band and may include, for example, signals associated with digital telephone and/or Internet service and ordering commands (i.e., for movies-on-demand and other services).

Each subscriber premises typically includes one or more power divider networks that are used to divide the downstream signals received from the service provider, so that the downstream signals may be fed to a plurality of service ports, such as wall outlets that are dispersed throughout the subscriber premises. These power divider networks also combine upstream signals that may be transmitted from one or more of the service ports into a composite upstream signal that is transmitted over the CATV network back to the headend facilities.

A recent trend is to use the coaxial cables that are installed throughout most homes, apartments and other subscriber premises as an "in-premises" network that may be used to transmit signals from a first end device that is connected to a first wall outlet in a subscriber premises to other end devices that are connected to other wall outlets in the subscriber premises. An industry alliance known as the Multi-media Over Coax Alliance ("MoCA") has developed standards which specify frequency bands, interfaces and other parameters that will allow equipment from different standards-compliant vendors to be used to distribute multi-media content over such in-premises coaxial cable networks. These standards specify that such "MoCA" content is transmitted over the in-premises coaxial cable networks in the 850 MHz to 1675 MHz frequency band, although some service providers only distribute MoCA content within a narrower frequency band that is above the cable television band, such as, for example, the 1,125 MHz to 1,675 MHz frequency band. Thus, the MoCA content is transmitted over the in-premises network in a pre-selected MoCA frequency band. The power divider network in the in-premises network may be designed to support communications between its output ports in this pre-selected MoCA frequency band.

Examples of MoCA content that may be distributed over an in-premises coaxial cable network are digital television, video-on-demand programming and digitally-recorded television or music programming. In an exemplary application, such programming may be transmitted via the in-premises network of a home from a primary set-top box (which may be a full service set top box having a digital television receiver, DVR and/or video-on-demand capabilities, etc.) to less capable, less expensive, auxiliary set-top boxes that are installed on other televisions throughout the premises or directly to televisions, DVD players, etc. with MoCA ports. In this manner, the full capabilities of the primary set top box may be enjoyed at all of the televisions within the residence without having to provide a primary set top box for each television.

In many cases, significant attenuation may occur as signals are passed through the cable television network of a service provider, and hence the power level of the RF signal that is received at a subscriber premises may be on the order of 0-5 dBmV/channel. Such received signal levels may be insufficient to support the various services at an acceptable quality of service level. Accordingly, an RF signal amplifier may be provided at or near an entrance point of an individual subscriber's premises. The RF signal amplifier is used to amplify the downstream RF signals to a more useful level. The RF signal amplifier may also be configured to amplify the upstream RF signals that are transmitted from the subscriber premises to the headend facilities of the cable television network. Typically, the RF signal amplifiers are incorporated into the power divider network as the first unit, which takes the form of a powered bi-directional RF signal amplifier with an input port for receiving a coaxial cable from the service provider side and plural output ports which receive coaxial cables connected to the various service ports, such as the wall outlets that are dispersed throughout the subscriber's premises.

In accordance with the known power divider network unit, a RF signal amplifier receives a composite downstream RF signal of approximately 5 dBmV/channel in the range of approximately 54-1,002 MHz comprising information for telephone, cable television (CATV), Internet, VoIP, and/or data communications from a service provider. The RF signal amplifier may increase this downstream signal to a more useful level of approximately 20 dBmV/channel at each output port of the unit and pass the amplified downstream signal to one or more devices in communication with the RF signal amplifier through connections to the various coaxial wall outlets. Such devices may include, but need not be limited to: televisions, modems, telephones, computers, and/or other communications devices known in the art. In the event of power failure, an unamplified signals may still be passed (in both directions) through a passive communications path between the service provider and at least one communications device.

FIG. 1 illustrates a block diagram of a bi-directional RF signal amplifier 100 according to the background art. More information concerning the bi-directional RF signal amplifier 100 can be found in the Assignee's U.S. Pat. No. 9,699,516, granted on Jul. 4, 2017, the entire contents of which are herein incorporated by reference.

The RF signal amplifier 100 includes a plurality of RF output ports 181-188 that may be used to pass downstream and upstream signals between a service provider and multiple communications devices located in the subscriber premises when the RF signal amplifier is powered and operating normally. Moreover, RF signal amplifier 100 further includes a non-interruptible RF output port 189 that may be used to maintain bi-directional RF communications even during power outages.

As shown in FIG. 1, RF signal amplifier 100 includes a bi-directional RF input port 105 for receiving downstream RF signals from a service provider, or any other appropriate signal source. RF input port 105 can also pass upstream signals in the reverse direction from the RF signal amplifier 100 to the service provider. Due to the bi-directional nature of communications through RF signal amplifiers, it will be appreciated that an "input" port will act as an "output" port and an "output" port will act as an "input" port if the direction of signal flow is reversed. Consequently, it will be appreciated that the terms "input" and "output" are used herein solely for purposes of distinguishing various ports from one another, and are not used to require a direction of signal flow.

As noted above, RF signal amplifier 100 further includes a plurality of bi-directional output ports 181-189 that may be used to pass downstream RF signals from the RF signal amplifier 100 to one or more devices in communication with the output ports 181-189, and to receive upstream RF signals from those devices so that they may be passed through the RF signal amplifier 100 to the service provider. It will be appreciated that any appropriate device that may advantageously send and/or receive an RF signal may be placed in communication with one or more of the various output ports 181-189. For example, it is contemplated that telephone, CATV, Internet, VoIP, and/or data communication devices may be placed in such communication with a service provider where the RF signal amplifier 100 is installed in the residence of a subscriber. However, it will further be appreciated that any desired combination of these and/or other devices may be used where appropriate.

Signals received through RF input port 105 can be passed through RF signal amplifier 100 via an active communications path 114 that extends between RF input port 105 and RF output ports 181-188 and/or 189. Specifically, the downstream signals that are received at RF input port 105 from the service provider are passed to a passive directional coupler 110 that has a first output port that connects to the active communications path 114 and a second output port that connects to a passive communications path 118. The directional coupler 120 splits downstream RF signals onto the active communications path 114 and the passive communications path 118. It will be appreciated that the directional coupler 120 may either evenly or unevenly split the power of the downstream signals between the communications paths 114, 118, depending on the design of the overall circuit. The active communications path 114 amplifies at least one of downstream signals from the service provider to the subscriber premises or upstream signals from the subscriber premises to the service provider. The passive communications path 118 acts as a "non-interruptible" communications path that has no active components thereon, which allows downstream and/or upstream signals to traverse the passive communications path 118 even if a power supply to the RF signal amplifier 100 is interrupted. In some embodiments, the passive communications path 118 may provide a communications path for VoIP telephone service that will operate even during power outages at the subscriber premises (assuming that the modem and/or telephone, as necessary, are powered by a battery backup unit).

As is further shown in FIG. 1, downstream signals traversing the active communications path 114 pass from the first output of directional coupler 110 to an input port of a switching device such as, for example, an SPDT non-latching relay 120. A first output 122 of the relay 120 is connected to an input of a high/low diplexer 130. A second output 124 of the relay 120 is connected to a resistor 126, such as a 75 ohm resistor connected between the second output 124 and ground.

The diplexer 130 separates the high frequency downstream signal from any low frequency upstream signals incident in the reverse direction. In various embodiments, diplexer 130 can filter the signals in a manner such that signals with frequencies greater than approximately 45-50 MHz are passed as high frequency downstream signals, while signals with frequencies lower than such range are passed in the reverse direction as low frequency upstream signals received from ports 181-188. It will be appreciated, however, that other diplexer designs may be utilized.

The high frequency downstream signals filtered by diplexer 130 can be amplified by individual power amplifier 140, and passed through a second high/low diplexer 150 to a MoCA rejection filter 160. MoCA rejection filter 160 attenuates any frequencies in the MoCA frequency range. Typically, no signals in the downstream direction will contain MoCA frequencies and hence the downstream signal will be unaffected.

Next, the downstream signal passes to an input 169 of a power divider network 170. The power divider network 170 splits the downstream signal so that it may be distributed to each of ports 181-188. In the embodiment of FIG. 1, the power divider network 170 includes a power divider 171 in a first tier, feeding power dividers 172 and 173 in a second tier, feeding power dividers 174, 175, 176 and 177 in a third tier. The first, second and third tiers form a pyramid structure. While the power divider network 170 illustrated in FIG. 1 splits the downstream signals for distribution to eight different ports, it will be appreciated that the power divider network 170 may split the downstream signals for distribution to different numbers of ports (e.g., four, six, ten, etc.).

Turning now to the reverse (upstream) signal flow through the active communications path 114 of RF signal amplifier 100, upstream signals received by the RF signal amplifier 100 from devices in communication with ports 181-188 are passed to power divider network 170 where they are combined into a composite upstream signal. This composite upstream signal is fed out of input 169 through the MoCA rejection filter 160. The MoCA rejection filter 160 attenuates frequencies in the MoCA frequency range so as to prevent the MoCA signaling, which freely traverses between the ports 181-188, from entering the high/low diplexer 150. The high/low diplexer 150 separates the low frequency composite upstream signal from any high frequency downstream signals incident in the forward direction. As previously discussed in relation to diplexer 130, the diplexer 150 can filter the signals such that signals with frequencies greater than approximately 45-50 MHz are passed in the forward direction as high frequency downstream signals, while signals with frequencies lower than such range are passed in the reverse direction as low frequency upstream signals received from ports 181-188.

The composite low frequency upstream signal filtered by diplexer 150 can be passed directly to high/low diplexer 130 (or optionally the upstream signal filtered by the diplexer 150 can pass through an upstream power amplifier 142 prior to reaching the diplexer 130), where it is then passed through the first output port 122 of the non-latching SPDT relay 120 to the first output port of the directional coupler 110. The directional coupler 110 combines the upstream signal received at output port 122 with any upstream signal received from the passive communications path 118 and passes this combined signal to the RF input port 105 for output to a service provider or other entity in communication with RF input port 105.

The power amplifiers 140 and 142 that are included on the active communications path 114 are active devices that must be powered via a power source, such as a DC linear regulator 195 that outputs a power supply voltage VCC. During normal operation, the RF signal amplifier 100 can be powered from a power input port 190 and/or power that is reverse fed through one of the RF output ports (e.g., output port 188, which is labeled "VDC IN"). In a typical installation at a subscriber premises, it is contemplated that RF signal amplifier 100 may be powered by an AC/DC adapter receiving power provided by the residence (for example, 100-230 VAC, 50/60 Hz). As illustrated in FIG. 1, the power received from either power input 190 or power input 188 may be provided to the DC voltage regulator 195 which supplies an operating voltage VCC to the power amplifiers 140 and 142.

In the event that power to the DC voltage regulator 195 is interrupted, DC voltage regulator 195 will be unable to provide operating voltage VCC to power amplifiers 140 and 142. Consequently, during power outages, the downstream portion (and also the upstream portion, if the upstream power amplifier 142 is employed) of the active communications path 114 will be lost.

As noted above, RF signal amplifier 100 also has the passive communications path 118 that extends from the second output of the directional coupler 120 to the port 189. This passive communication path 118 bypasses the power amplifiers 140 and 142 and does not include any active components. Consequently, the passive communications path 118 will remain available to pass communications between port 105 and port 189, even when the power supply to RF signal amplifier 100 is interrupted. Accordingly, the passive communications path 118 is also referred to as a "non-interruptible" communications path. The passive communications path 118 may be used to maintain essential services to the subscriber premises such as, for example, 911 emergency lifeline services, even during power outages, so long as the subscriber has a battery backup for the necessary devices connected to port 189.

The passive communications path 118 is connected to the active communications path 114 at the input 169 of the power divider network 170. Within the passive communication path 118, upstream signals from the port 189 pass into an input 168 of a diplexer 162. Signals in the MoCA frequency range exit the diplexer 162 via output 164 and pass to the active communication path directly upstream of the power divider network 170. By this arrangement, MoCA signals from the port 189 may enter the input 169 of the power divider network 170. Hence, MoCA signals may be passed between all of the devices connected to ports 181-189.

The signals from the port 189 which pass into the input 168 of a diplexer 162, which are in the high/low frequency range for downstream and upstream communication with the service provider exit the diplexer 160 via output 166 and pass to the second output of the directional coupler 110, where the signals are combined with the signals on the active communication path 114 and are then passed to the port 105.

Additional background art can be found in U.S. Pat. Nos. 3,676,744; 6,969,278; 7,530,091; 8,695,055; 8,752,114; 8,810,334; 9,209,774; 9,356,796 and 9,743,038, and in U.S. Published Applications 2005/0044573; 2006/0205442 and 2013/0081096, which are herein incorporated by reference.

SUMMARY OF THE INVENTION

The Applicant has appreciated some drawbacks in the RF signal amplifier 100 of FIG. 1. One drawback is that the downstream signal from the service provider must be provided to the port 105 at a relative high power level, or the downstream amplifier 140 must be made rather robust and will consume a high level of power, if the CATV signal is to be provided at each of the ports 181-188 at a power level sufficient to provide a high quality of service. In other words, assuming that each power divider 171-177 is set to split the incoming signal power to 50% going to each output leg, the CATV signal entering the input 169 of the power divider 170 will be reduced by at least 87.5% before it reaches the port 181. At best (assuming no losses in the power dividers 171-177) each of the eight ports 181-188 will present, at best, 12.5% of the signal power level initially present at the input 169 into the power divider network 170.

The Applicant has appreciated that it is common in household installations that not every coaxial outlet in the subscriber's premises, e.g. a house, needs to be prepared for CATV downstream signal feeds. Rather, many of the coaxial outlets are simply used for MoCA devices. For example, a small household might need only a single coaxial outlet with CATV downstream and upstream signaling abilities. That single output might have a rather expensive set top box with DVR abilities and a modem for internet communications. Other outlets in the house might only need MoCA abilities. For example, a TV that is used to watch recorded events from the DVR, a computer that interacts with the modem for internet access, a VoIP phone that interacts with the modem, a gaming station that only interacts with another gaming station at another wall outlet, etc.

Therefore, the Applicant has appreciated a new device, which functions as a building block to create a power divider network which is custom tailored to the installation demands. The building blocks are modular, self-contained housings, with an input and at least two outputs. The installer may configure, and reconfigure at a later date, one or more units to form a power divider network best suited to the installation at hand.

The power divider network built with one or more units will allow the incoming CATV signal to be received at a lower power level (saving money and equipment) on the service provider side, and/or will allow the downstream amplifier 140 of the RF signal amplifier 100 to be made less robust and/or to consume less power (saving initial equipment cost and/or operation costs) on the subscriber side.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limits of the present invention, and wherein.

DETAILED DESCRIPTION OF EMBODIMENTS OF THE INVENTION

Figure 1:
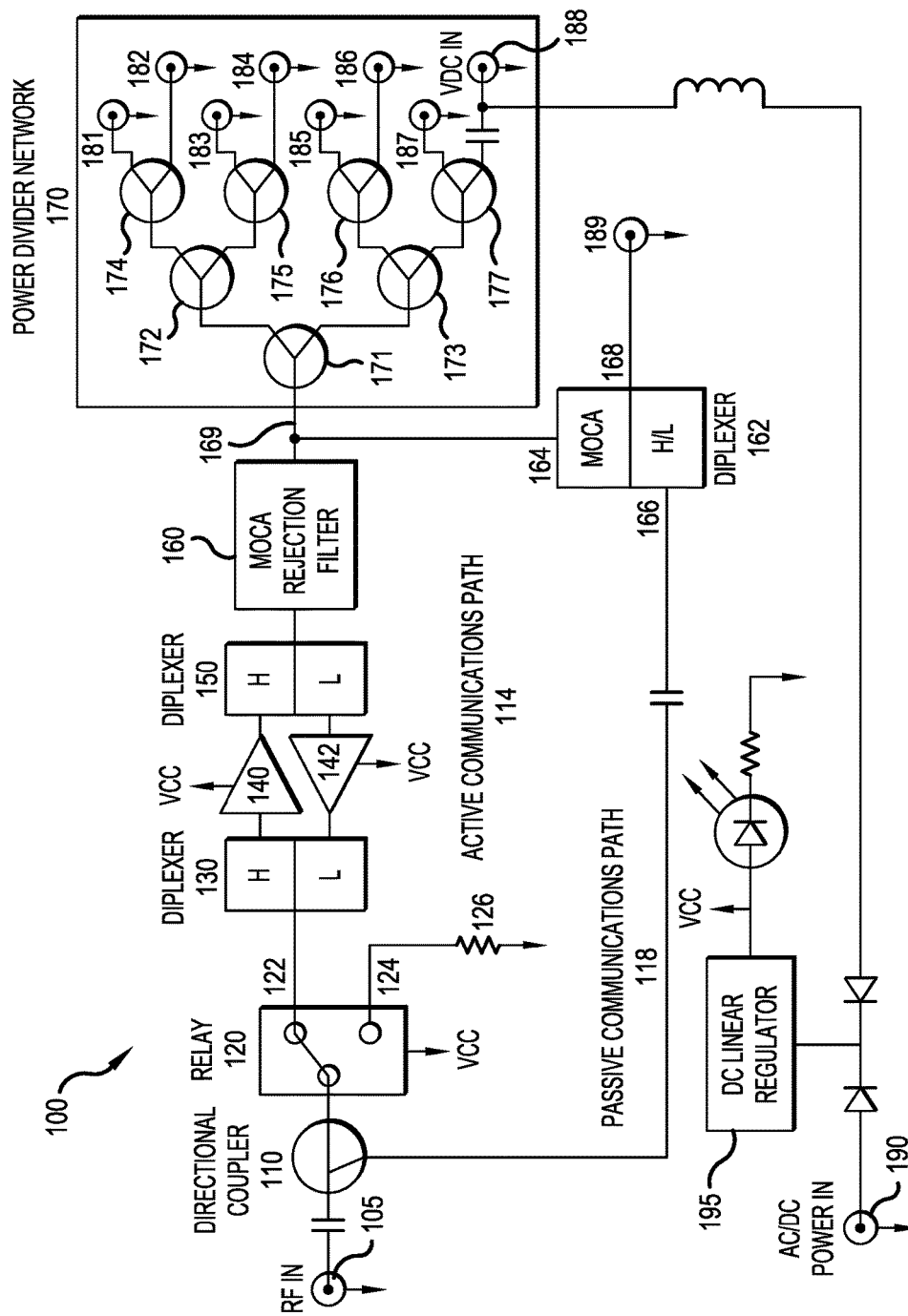
FIG. 1 is a block diagram of a bi-directional RF signal amplifier, according to the background art.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 2:
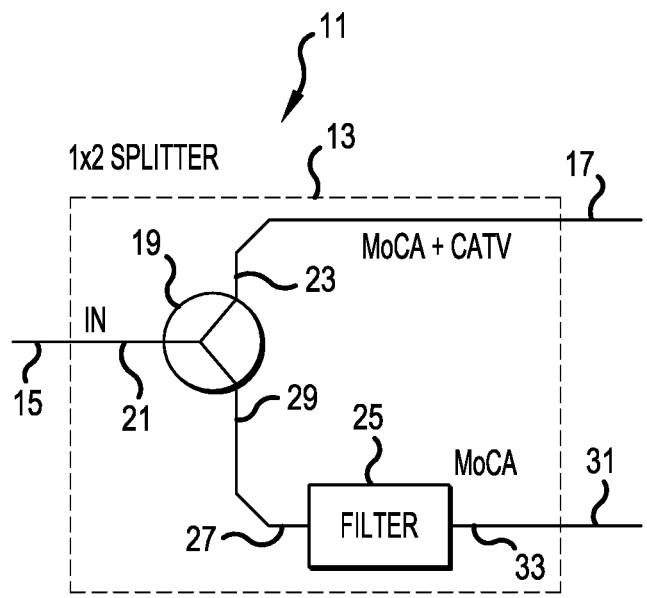
FIG. 2 is a block diagram of a first splitter, according to the present invention.
Figure 3:
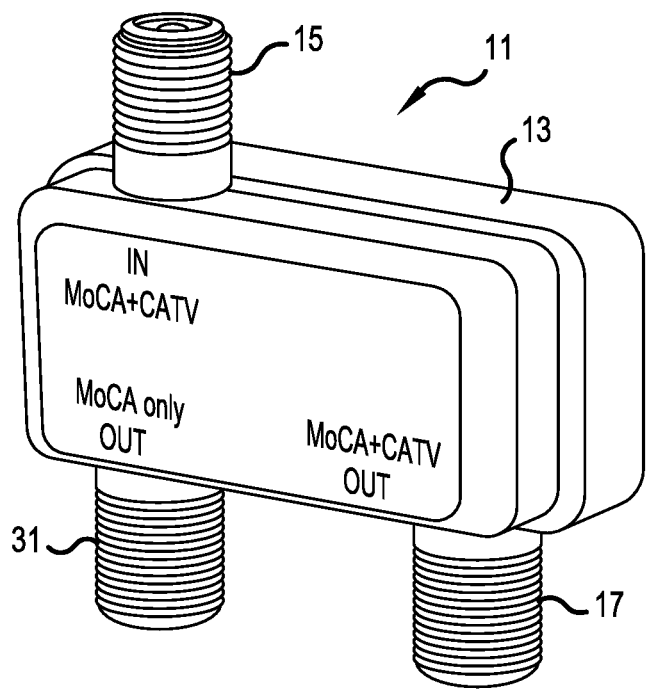
FIG. 3 is a perspective view of the first splitter of FIG. 2.

FIG. 2 is a block diagram of a first CATV & MoCA splitter 11 and FIG. 3 is an outside perspective view of the first splitter 11 of FIG. 2. The first splitter 11 includes a housing 13. A first coaxial port 15 is attached to the housing 13. The first coaxial port 15 may be labeled as an "in" or "input," however the first coaxial port 15 may both receive and send signals. The designation of "in" may be used to designate that the first coaxial port 15 should be connected to a coaxial cable coming from a service provider side, providing such signals as television programming and signals from the Internet. The service provider side also receives signals, such as customer selections for television programming and telephone and internet communications from a subscriber.

A second coaxial port 17 is also attached to the housing 13. The second coaxial port 17 is connected to the first coaxial port 15 so that all frequencies presented to the first coaxial port 15 can pass to the second coaxial port 17, and so that all frequencies presented to the second coaxial port 17 can pass to the first coaxial port 15.

A first power divider element 19 is provided within the housing 13. A first terminal 21 of the first power divider element 19 is directly connected to the first coaxial port 15 without any intervening circuit element. A second terminal 23 of the first power divider element 19 is directly connected to the second coaxial port 17 without any intervening circuit element. The phrase "without any intervening circuit element" means without any circuit element directly electrically connected to the electrical conductivity path between the two end elements, e.g., the first power divider element 19 and the second coaxial port 17, wherein a circuit element is a structure like a resistor, an inductor, a capacitor, a diode, etc. or a plurality of circuit elements forming a filter, a surge arrestor, etc.

A high pass filter 25 is located within the housing 13. The high pass filter 25 has a first terminal 27 connected to the first coaxial port 15. More particularly, the first terminal 27 of the high pass filter 25 is directly connected to a third terminal 29 of the first power divider element 19 without any intervening circuit element. Hence, the first terminal 27 of the high pass filter 25 is connected to the first coaxial port 15 via the first power divider element 19.

The first terminal 21 of the first power divider element 19 may be considered to be an input and the second and third terminals 23 and 29 of the first power divider element 19 may be considered to be outputs. The input signal power at the first terminal 21 may be split evenly (50/50) between the second and third terminals 23 and 29, so that the full frequency spectrum of the input signal is available at each of the output terminals, but is attenuated by approximately 50%. Alternatively, the power split need not be 50/50. The input signal may be split by other ratios, like 55/45, 60/40, 65/35, 70/30, etc., and the power split may favor the second terminal 23 or the third terminal 29. In a preferred embodiment, the power split favors the second terminal 23 and the ratio is about 70/30.

A third coaxial port 31 is attached to the housing 13. The third coaxial port 31 is directly connected to a second terminal 33 of the high pass filter 25 without any intervening circuit element.

Figure 4:
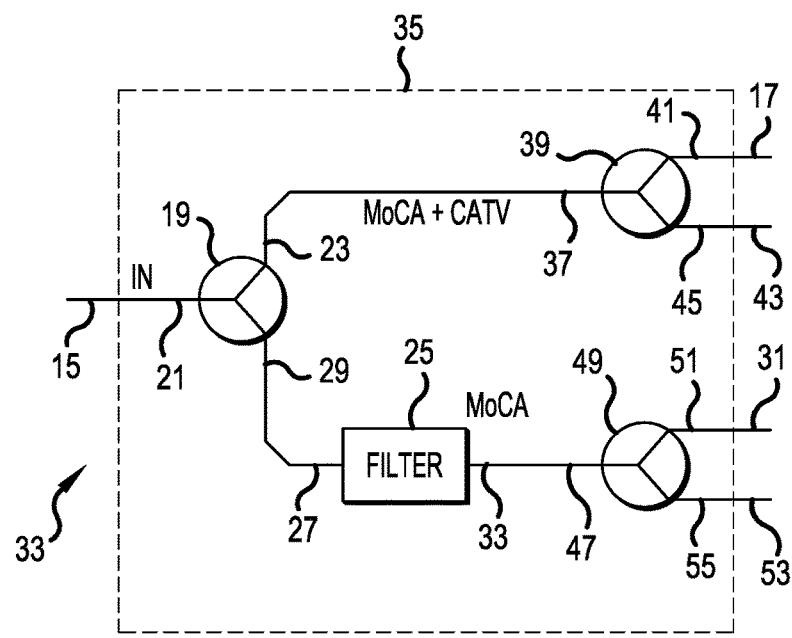
FIG. 4 is a block diagram of a second splitter, according to the present invention.
Figure 5:
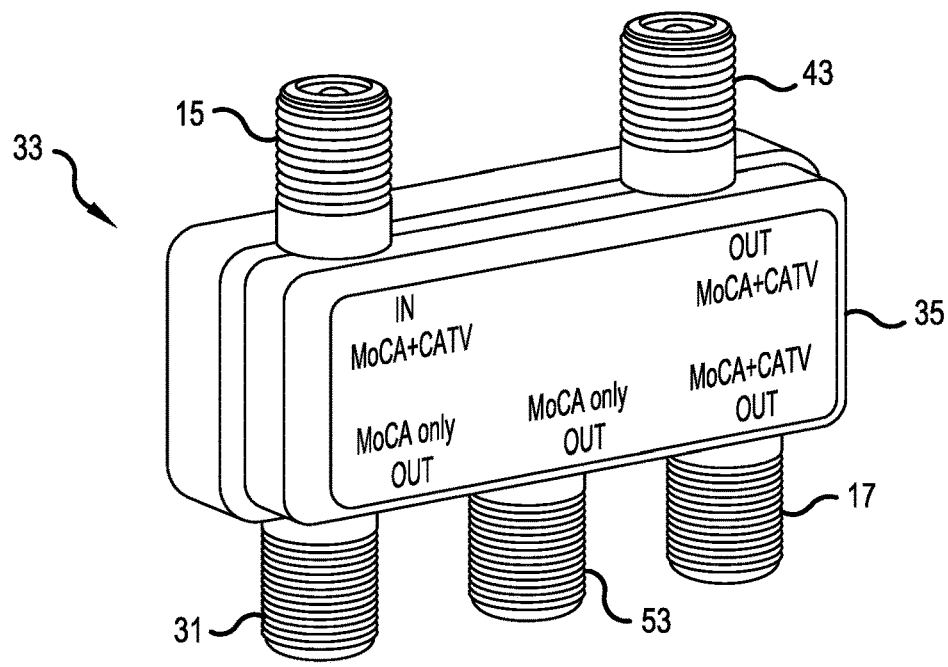
FIG. 5 is a perspective view of the second splitter of FIG. 4.

FIG. 4 is a block diagram of a second CATV & MoCA splitter 33 and FIG. 5 is an outside perspective view of the second splitter 33 of FIG. 4. The second splitter 33 has many elements in common with the first splitter 11 of FIGS. 2 and 3. Elements which have the same name and function have been labeled with the same reference numeral.

The second splitter 33 includes an enlarged housing 35. The first coaxial port 15 is attached to the enlarged housing 35. The first coaxial port 15 may be labeled as an "in" or "input," however the first coaxial port 15 may both receive and send signals.

The second coaxial port 17 is also attached to the enlarged housing 35. The second coaxial port 17 is connected to the first coaxial port 15 so that all frequencies presented to the first coaxial port 15 can pass to the second coaxial port 17, and so that all frequencies presented to the second coaxial port 17 can pass to the first coaxial port 15.

The first power divider element 19 is provided within the housing 13. The first terminal 21 of the first power divider element 19 is directly connected to the first coaxial port 15 without any intervening circuit element. The second terminal 23 of the first power divider element 19 is connected to the second coaxial port 17.

The high pass filter 25 is located within the enlarged housing 35. The high pass filter 25 has the first terminal 27 directly connected to the third terminal 29 of the first power divider element 19 without any intervening circuit element. The third coaxial port 31 is attached to the enlarged housing 35. The third coaxial port 31 is connected to the second terminal 33 of the high pass filter 25.

With the second splitter 33, the second terminal 23 of the first power divider element 19 is not directly connected to the second coaxial port 17. Rather, the second terminal 23 of the first power divider element 19 is directly connected to a first terminal 37 of a second power divider element 39 without any intervening circuit element. A second terminal 41 of the second power divider element 39 is directly connected to the second coaxial port 17 without any intervening circuit element.

A fourth coaxial port 43 is attached to the enlarged housing 35. The fourth coaxial port 43 is connected to the first coaxial port 15 so that all frequencies presented to the first coaxial port 15 can pass to the fourth coaxial port 43, and so that all frequencies presented to the fourth coaxial port 43 can pass to the first coaxial port 15. As best seen in FIG. 4, the fourth coaxial port 43 is directly connected to a third terminal 45 of the second power divider element 39 without any intervening circuit element. In a preferred embodiment, the second power divider element 39 provides a 50/50 power split between the second and third terminals 41 and 45.

With the second splitter 33, the second terminal 33 of the high pass filter 25 is not directly connected to the third coaxial port 31. Rather, the second terminal 33 of the high pass filter 25 is directly connected to a first terminal 47 of a third power divider element 49 without any intervening circuit element. A second terminal 51 of the third power divider element 49 is directly connected to the third coaxial port 31 without any intervening circuit element.

A fifth coaxial port 53 is attached to the enlarged housing 35. The fifth coaxial port 53 is directly connected to a third terminal 55 of the third power divider element 49 without any intervening circuit element. In a preferred embodiment, the third power divider element 49 provides a 50/50 power split between the second and third terminals 51 and 55.

Figure 6:
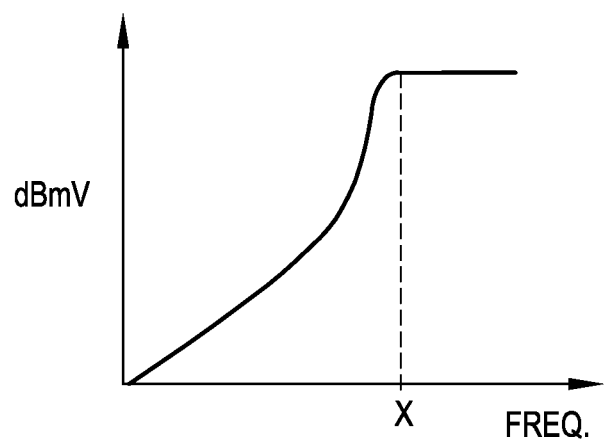
FIG. 6 is a graphical representation of the performance of a high pass filter, which attenuates below the passed frequencies.

The high pass filter 25 of FIGS. 2 and 4 passes frequencies in a range of 850 MHz to 1,675 MHz and attenuates frequencies below the range. Sometime service providers will provide entertainment and information services and receive customer data in a bandwidth extending up to or exceeding about 1,000 MHz. Therefore, in another embodiment, the high pass filter 25 passes frequencies in a range of 1,125 MHz to 1,675 MHz and attenuates frequencies below the range. FIG. 6 is a graphical representation of the performance of the high pass filter 25, where the value X is set at 850 MHz or 1,125 MHz, depending upon the lower end cutoff frequency, as mentioned above.

Figure 7:
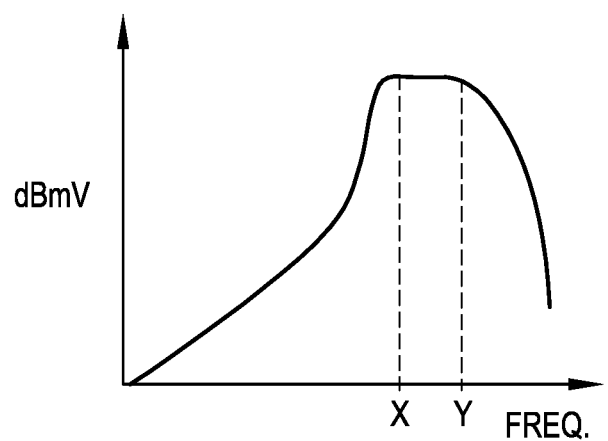
FIG. 7 is a graphical representation of the performance of a high pass filter, which attenuates frequencies below and above the passed frequencies.

In either embodiment, the high pass filter 25 is intended to allow MoCA band frequencies to pass freely through the high pass filter 25 in both directions, e.g., passing from the third terminal 29 of the first power divider element 19 to the third coaxial port 31, and passing from the third coaxial port 31 to the third terminal 29 of the first power divider element 19. In either embodiment, the high pass filter 25 may optionally attenuate frequencies above the range. By attenuating frequencies above the ranges, i.e., above 1,675 MHz, noise can be suppressed in the MoCA signaling. Noise can occur from such household sources as cordless phones, cell phones, wireless alarm system sensors and cameras, WiFi routers and repeaters, connected WiFi devices, etc. FIG. 7 is a graphical representation of the performance of the high pass filter 25, where the value X is set at 850 MHz or 1,125 MHz, depending upon the lower end cutoff frequency, and Y is set at 1,675 MHz.

Now with reference to FIGS. 8-11, a customized subscriber network system, using the building blocks of the present invention, will be illustrated. Referring back to FIG.

Figure 8:
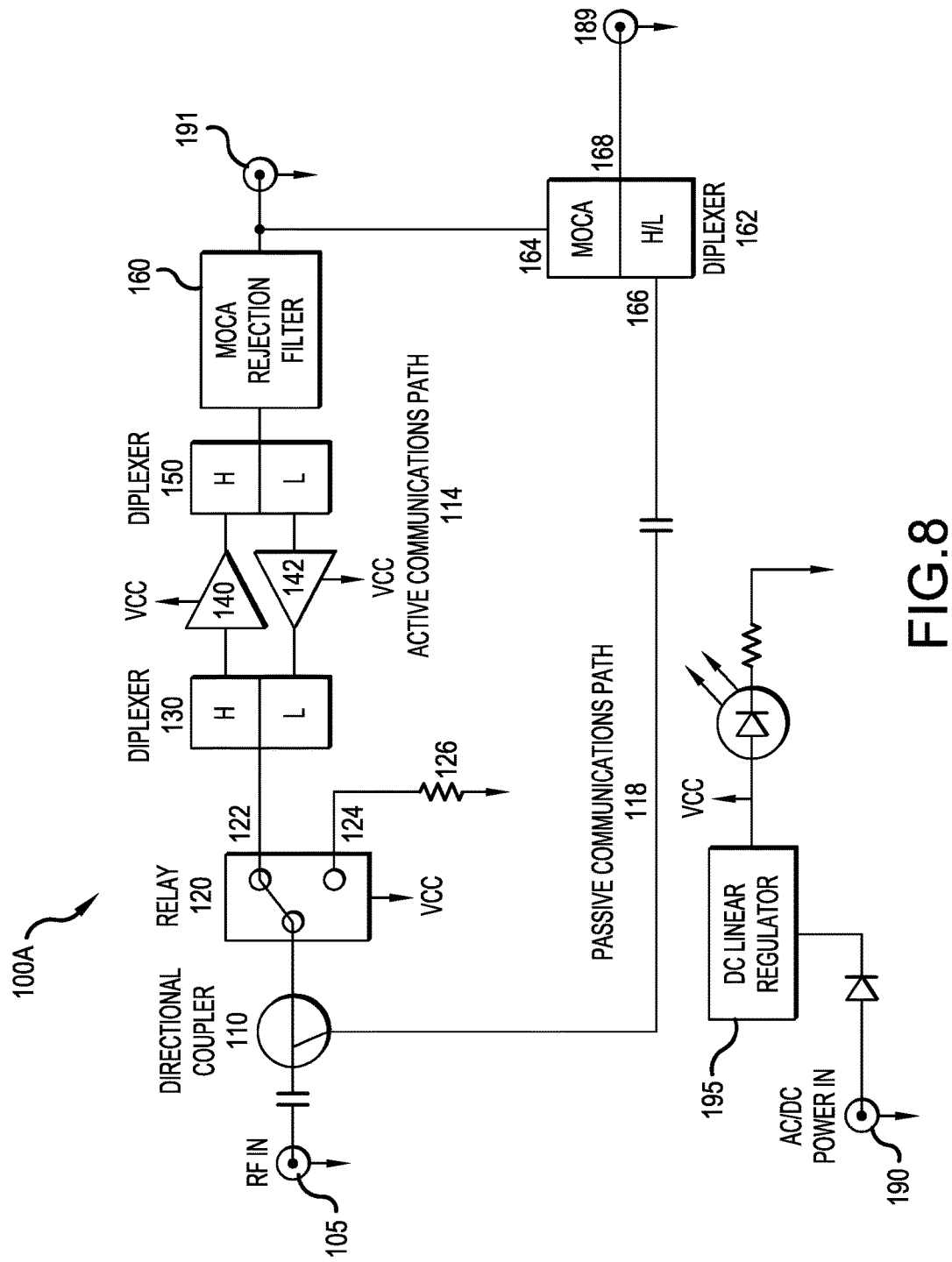
FIG. 8 is a block diagram of a modified, bi-directional RF signal amplifier.

1, the RF signal amplifier 100 is altered to form a modified RF signal amplifier 100A, as shown in FIG. 8. The main modification is that the power divider network 170 is eliminated and the electrical connection from the RF output port 188 to the DC linear regulator 195 is removed. The elements of the RF signal amplifier 100 are maintained up to the point of the input 169 of the power divider network 170, but the input 169 is converted into a coaxial output port 191 accessible on the outside of a housing 101 (See FIG. 9) of the modified RF signal amplifier 100A.

Figure 9:
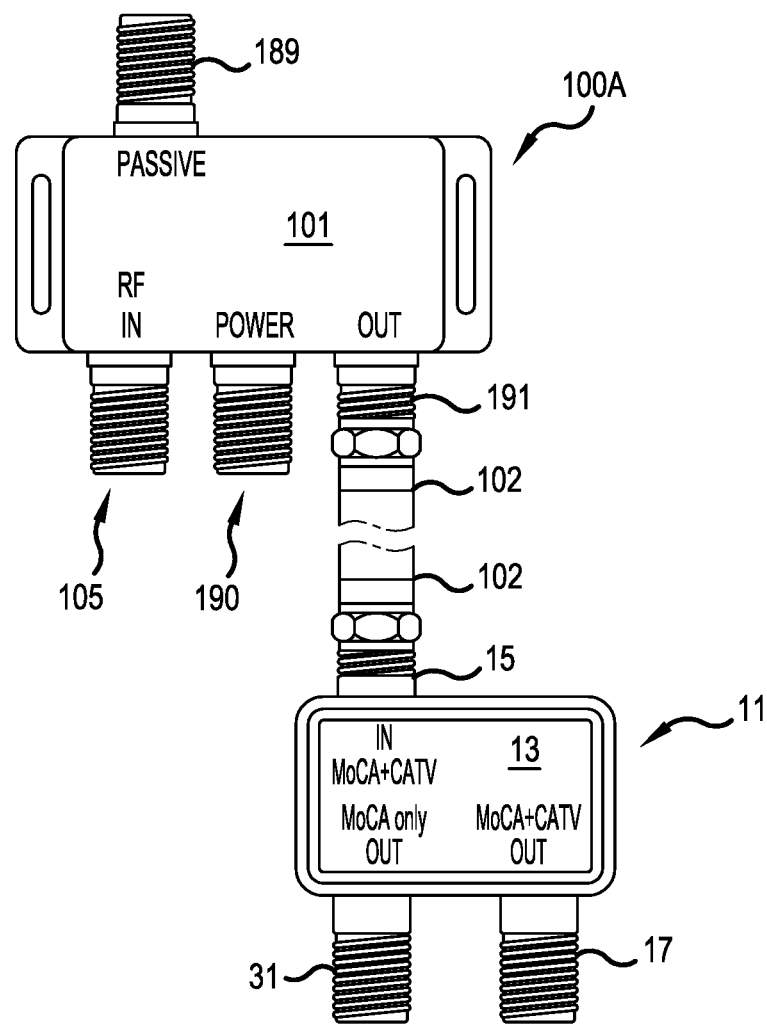
FIG. 9 is a plan view of the modified, bi-directional RF signal amplifier of FIG. 8 in combination with the first splitter of FIGS. 2 and 3.

FIG. 9 shows the modified RF signal amplifier 100A of FIG. 8 connected to the first splitter 11 of FIG. 3. The coaxial port 191 of the modified RF signal amplifier 100A is connected to the first coaxial port 15 of the first splitter 11 by a coaxial cable 102. In the configuration of FIG. 9, a set top box may be connected to second coaxial port 17. The set top box may receive and send data relating to CATV programming and communicate with the Internet.

The set top box may also transmit MoCA signals into the second coaxial port 17. The MoCA signals from the second coaxial port 17 will be available at the third coaxial port 31 and the non-interruptible RF output port 189. Likewise, MoCA signals transmitted into the non-interruptible RF output port 189 will be available at the third coaxial port 31 and the second coaxial port 17. Also, MoCA signals transmitted into the third coaxial port 31 will be available at the second coaxial port 17 and the non-interruptible RF output port 189. MoCA signals in the above three situations would not pass to the RF input port 105 due to attenuation by the MoCA rejection filter 160 and H/L side of the diplexer 162 in the passive communication path 118. The configuration of FIG. 9 allows a simple installation in a subscriber's premises which needs one active RF CATV & MoCA port, one passive RF CATV & MoCA port and one "MoCA only" port.

Figure 10:
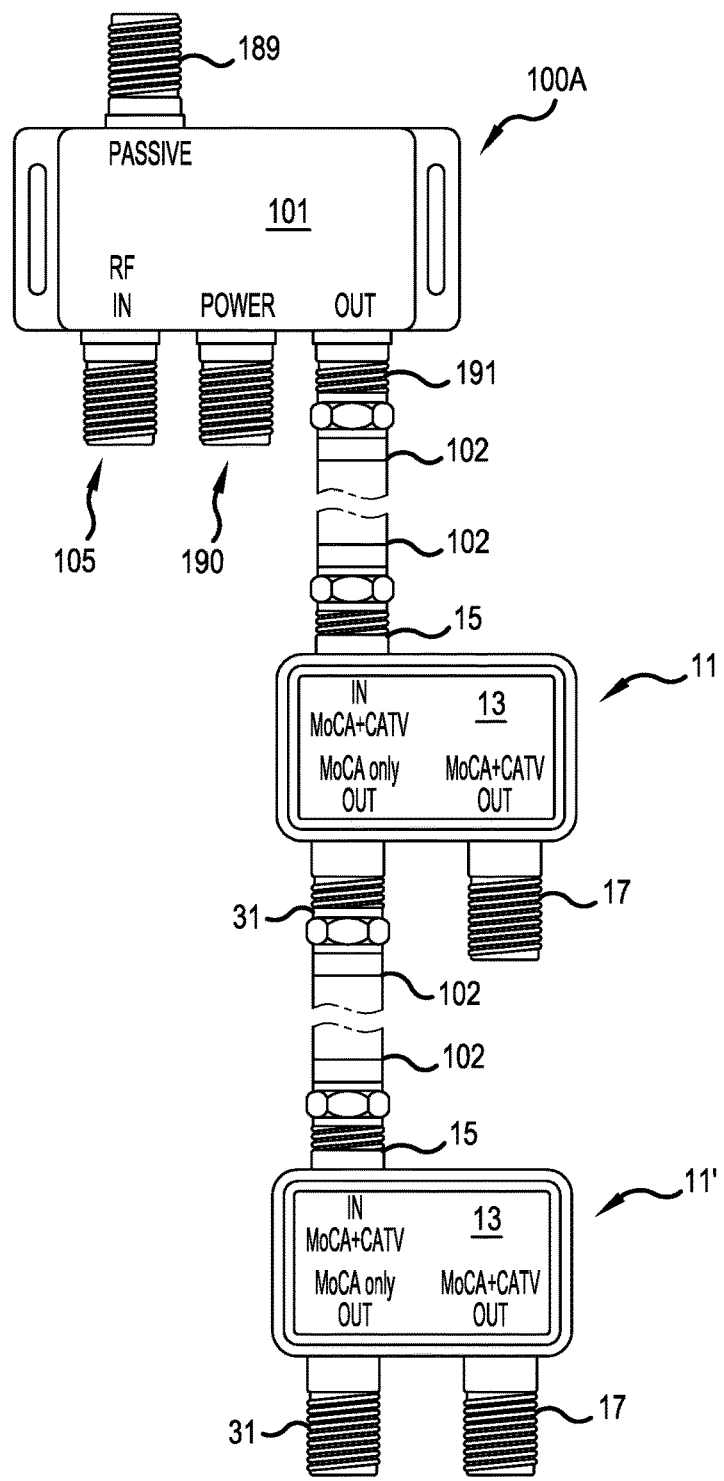
FIG. 10 is a plan view of the modified, bi-directional RF signal amplifier of FIG. 8 in combination with two of the first splitters of FIGS. 2 and 3.

FIG. 10 shows a configuration wherein another first splitter 11' has been mated to the third coaxial port 31. More specifically, a coaxial cable 102 connects the third coaxial port 31 of the upstream first splitter 11 to the first coaxial port 15 of the downstream first splitter 11'.

The configuration of FIG. 10 allows a simple installation in a subscriber's premises which needs one active RF CATV & MoCA port, one passive RF CATV & MoCA port and two "MoCA only" ports. Note that because the downstream first splitter 11' is mated to the "MoCA only" third coaxial port of 31 of the upstream first splitter 11, that both the second and third coaxial ports 17 and 31 of the downstream first splitter 11' become "MoCA only" ports.

Figure 11:
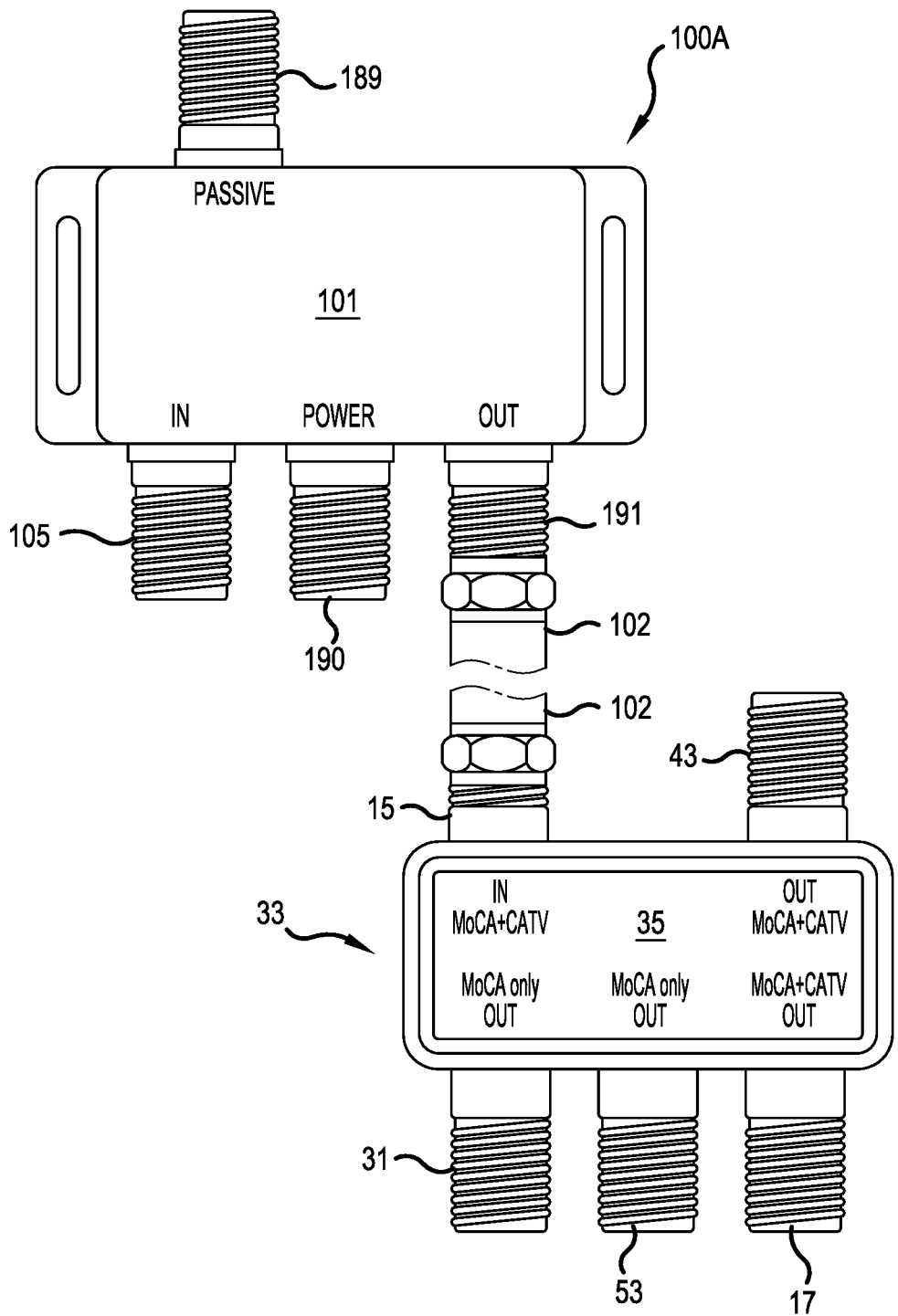
FIG. 11 is a plan view of the modified, bi-directional RF signal amplifier of FIG. 8 in combination with the second splitter of FIGS. 4 and 5.

FIG. 11 shows a configuration wherein the second splitter 33 of FIGS. 4 and 5 has been mated to the modified RF signal amplifier 100A of FIG. 8. More specifically, the coaxial output port 191 of the modified RF signal amplifier 100A is connected to the first coaxial port 15 of the second splitter 33 by a coaxial cable 102.

The configuration of FIG. 11 allows a simple installation in a subscriber's premises which needs two active RF CATV & MoCA ports (namely ports 17 and 43 of the second splitter 33), one passive RF CATV & MoCA port (namely port 189 of the modified RF signal amplifier 100A) and two "MoCA only" ports (namely ports 31 and 53 of the second splitter 33).

If an additional "MoCA only" port were needed, the first splitter 11 (FIGS. 2 and 3) could be connected downstream to the second splitter 33. More specifically, a coaxial cable 102 could be used to connect the third coaxial port 31 of the second splitter 33 to the first coaxial port 15 of the downstream first splitter 11. Note that because the downstream first splitter 11 is mated to the "MoCA only" third coaxial port of 31 of the upstream second splitter 33, that both the second and third coaxial ports 17 and 31 of the downstream first splitter 11 become "MoCA only" ports.

FIGS. 9-11 illustrate how the first and second splitters 11 and 33 can be used to generate a customized subscriber network system. One advantage of the present system is that the service provider need not boost up the signal entering a subscriber's premises. In the background art of FIG. 1, the RF signal amplifier 100 had eight amplified output ports 181-188, and each port had the ability to support bi-directional communication with the service provider. The power of the downstream signal needed to be at least eight times the power level needed for a single port, since the downstream signal passed through three 50/50 power dividers, e.g., power dividers 171, 172 and 174, before reaching the CATV & MoCA output port 181.

With the present invention, the downstream signal only passes through a single power divider 19 in the case of the first splitter 11 (FIGS. 2 and 3). Also, the power divider 19 could be set up to split the incoming signal 70/30 in favor of the second terminal 23 of the power divider 19. Hence, the output power level at the second coaxial port 17 is 70% of the incoming power level, as compared to 12.5% of the incoming power level with reference to the RF output port 181 of the background art in FIG. 1. That is more than five times the power level. Therefore, the service provider can provide a low power level at the drop for the subscriber's premises. Alternatively, the downstream amp 140 of the modified RF signal amplifier 100A can be made less robustly and/or can consume a lower level of power.

Figure 12:
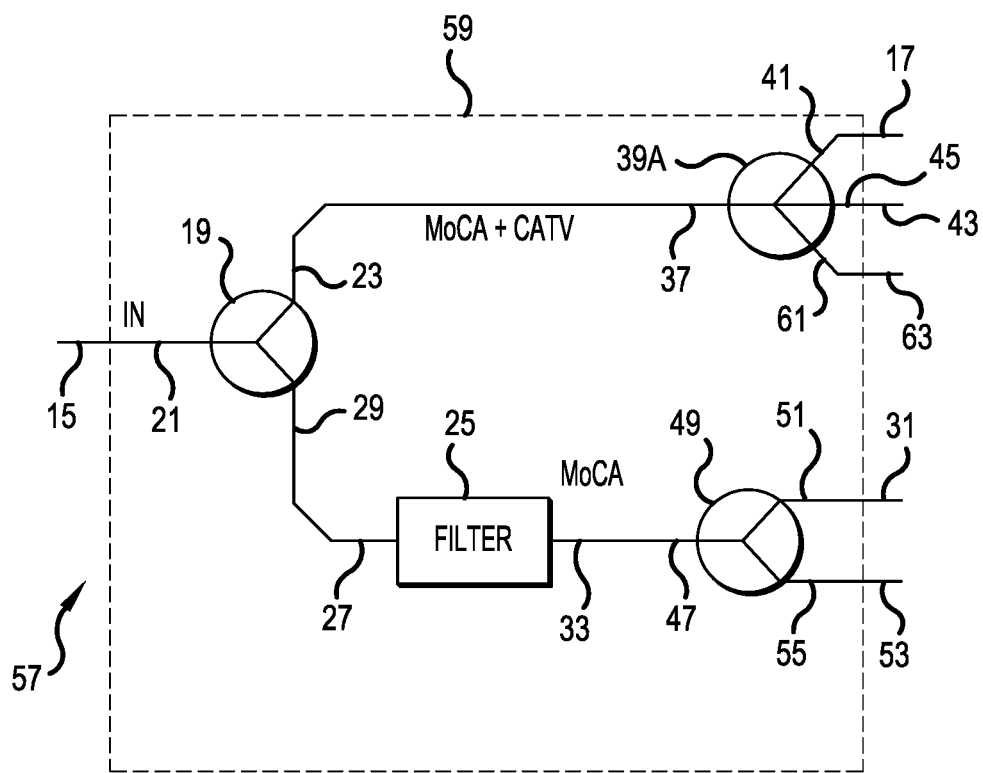
FIG. 12 is a block diagram of a third splitter, according to the present invention.

Although specific examples of a modified RF signal amplifier 100A and first and second splitters 11 and 33 have been shown, the structures may be modified while still being within the general teachings of the invention. For example, FIG. 12 shows a block diagram of a third CATV & MoCA splitter 57. The third splitter 57 has many elements in common with the second splitter 33 of FIGS. 4 and 5. Elements which have the same name and function have been labeled with the same reference numeral.

The third splitter 57 includes an oversized housing 59. Contrary to the second splitter 33, the second power divider element 39 (FIG. 4) is replaced with a modified, second power divider element 39A. The modified, second power divider element 39A has a fourth terminal 61. The fourth terminal 61 is directly connected to a sixth coaxial port 63, which is attached to the oversized housing 59. The sixth coaxial port 63 is connected to the first coaxial port 15 so that all frequencies presented to the first coaxial port 15 can pass to the sixth coaxial port 63, and so that all frequencies presented to the sixth coaxial port 63 can pass to the first coaxial port 15. In a preferred embodiment, the modified, second power divider element 39A provides a 33.3/33.3/33.3 power split between the second, third and fourth terminals 41, 45 and 61.

The third splitter 57 (FIG. 12) in combination with the modified RF signal amplifier 100A (FIG. 8) allows a simple installation in a subscriber's premises, which needs three active RF CATV & MoCA ports (namely ports 17, 43 and 63 of the third splitter 57), one passive RF CATV & MoCA port (namely port 189 of the modified RF signal amplifier 100A) and two "MoCA only" ports (namely ports 31 and 53 of the third splitter 57). Of course, additional "MoCA only" ports may be added by connecting another splitter downstream of the third splitter 57. For example, if a coaxial cable 102 is used to connect the third coaxial port 31 of the third splitter 57 to the first coaxial port 15 of the second splitter 33, the configuration would offer three active RF CATV & MoCA ports (namely ports 17, 43 and 63 of the third splitter 57), one passive RF CATV & MoCA port (namely port 189 of the modified RF signal amplifier 100A) and five "MoCA only" ports (namely port 53 of the third splitter 57 and ports 17, 31, 43 and 53 of the second splitter 33).

Figure 13:
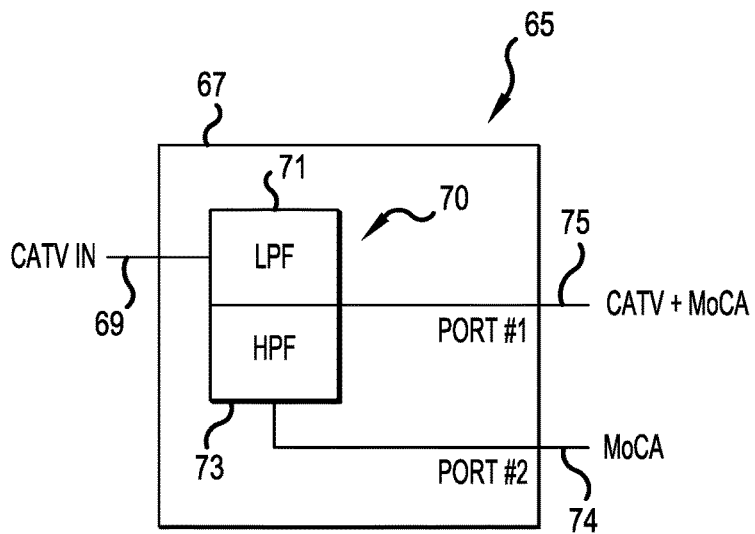
FIG. 13 is a block diagram of a fourth splitter, according to the present invention.

Now, with reference to FIG. 13, an alternative embodiment will be described. A fourth CATV & MoCA splitter 65 includes a housing 67. A first coaxial port 69 is attached to the housing 67. A diplexer 70 is located within the housing 67. The diplexer 70 has a low pass filter side 71. The low pass filter side 71 of the diplexer 70 is directly connected to the first coaxial port 69 without any intervening circuit element.

The diplexer 70 also has a high pass filter side 73. A second coaxial port 74 is attached to the housing 67. The high pass filter side 73 of the diplexer 70 is directly connected to the second coaxial port 74 without any intervening circuit element.

A third coaxial port 75 is attached to the housing 67. The third coaxial port 75 is directly connected to the diplexer 70 without any intervening circuit element. The connection point places the third coaxial port 75 into communication with both the low pass filter side 71 and the high pass filter side 73 of the diplexer 70.

In operation, upstream and downstream CATV signals enter and exit via the first coaxial port 69. Such CATV signals are typically in a frequency band below 1125 MHz, such as in the range of 5 to 1,002 MHz. Such CATV signals freely pass through the low pass filter side 71 of the diplexer 70 and pass to and from the third coaxial port 75. Such CATV signals are attenuated by the high pass filter side 73 of the diplexer 70 and do not pass to or from the second coaxial port 74.

Upstream and downstream MoCA signals enter and exit via the second coaxial port 74. Such MoCA signals are typically in a frequency band above 1,125 MHz, such as in the range of 1,125 to 1,675 MHz. Such MoCA signals freely pass through the high pass filter side 73 of the diplexer 70 and pass to and from the third coaxial port 75. Such MoCA signals are attenuated by the low pass filter side 71 of the diplexer 70 and do not pass to or from the first coaxial port 69.

The fourth splitter 65 has some advantages over the first splitter 11 of FIGS. 2 and 3. If the fourth splitter 65 replaces the first splitter 11 in the configuration of FIG. 9, the modified RF signal amplifier 100A (FIG. 8) no longer needs the MoCA rejection filter 160. The diplexer 70 of the fourth splitter 65 prevents MoCA from exiting the first coaxial port 69, so that the MoCA rejection function is no longer required within the modified RF signal amplifier 100A. However, as a drawback, the fourth splitter 65 may not be daisy chained, or sequentially connected in tiers, as shown in FIG. 10. This is because MoCA signals will be blocked between the tiers by the low pass filter side 71 of the diplexer 70. In other words, if the first splitters 11 and 11' in FIG. 10 were replaced with the fourth splitters 65, MoCA signals could flow between the ports 74 and 75 of the downstream third splitter 65, but could not exit via the port 69 of the downstream third splitter 65 to be shared with the port 74 of the upstream third splitter 65 or the passive port 189 of the modified RF signal amplifier 100A.

Figure 14:
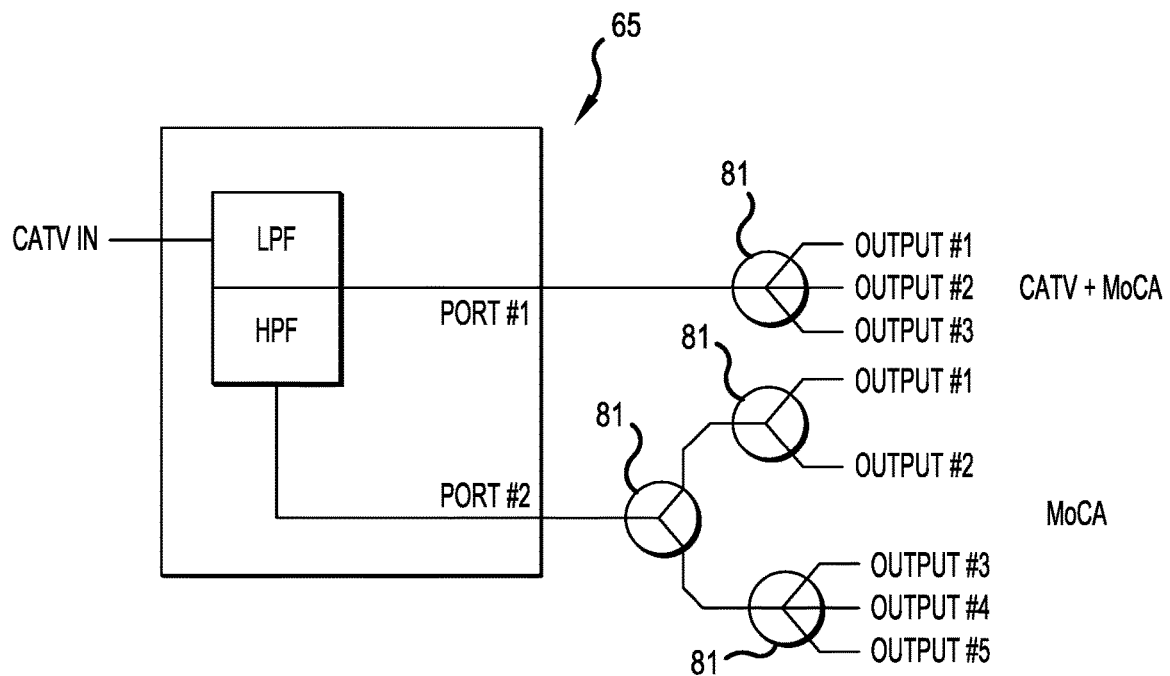
FIG. 14 is a block diagram of the fourth splitter of FIG. 13 connected to a series of power dividers.

FIG. 14 shows the fourth splitter 65 with external power dividers 81 connected to the second and third coaxial ports 74 and 75. The external power dividers 81 split the output signals up so that signals may be provided to multiple coaxial ports and hence multiple devices. For example, in FIG. 14, the power dividers 81 provide three CATV & MoCA ports and five "MoCA only" ports. The power dividers 81 may take the form of simple signal splitters, which pass all frequencies.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. A splitter comprising:
    a housing;
    a first power divider element within said housing;
    a first coaxial port attached to said housing;
    a second coaxial port attached to said housing, said second coaxial port being connected to said first coaxial port via said first power divider element so that all frequencies presented to said first coaxial port can pass to said second coaxial port, and so that all frequencies presented to said second coaxial port can pass to said first coaxial port;
    a high pass filter within said housing, said high pass filter having a first terminal connected to said first coaxial port via said first power divider element; and
    a third coaxial port attached to said housing, said third coaxial port being connected to a second terminal of said high pass filter, so that frequencies within said high pass filter's frequency range may pass from said first coaxial port to said third coaxial port, frequencies within said high pass filter's frequency range may also pass from said third coaxial port to said first coaxial port, and frequencies outside of said high pass filter's frequency range are attenuated by said high pass filter, wherein a first terminal of said first power divider element is connected to said first coaxial port, a second terminal of said first power divider element is connected to said second coaxial port, and said first terminal of said high pass filter is connected to a third terminal of said first power divider element.

2. The splitter according to claim 1, wherein said high pass filter passes frequencies in a range of 850 MHz to 1675 MHz and attenuates frequencies below the range.

3. The splitter according to claim 2, wherein said high pass filter passes frequencies in a range of 1125 MHz to 1675 MHz and attenuates frequencies below the range and also attenuates frequencies above the range.

4. The splitter according to claim 1, wherein a first terminal of said first power divider element is directly connected to said first coaxial port without any intervening circuit element, and said second terminal of said first power divider element is directly connected to said second coaxial port without any intervening circuit element.

5. The splitter according to claim 4, wherein said third coaxial port is directly connected to said second terminal of said high pass filter without any intervening circuit element.

6. The splitter according to claim 1, further comprising:
    a fourth coaxial port attached to said housing, said fourth coaxial port being connected to said first coaxial port so that all frequencies presented to said first coaxial port can pass to said fourth coaxial port, and so that all frequencies presented to said fourth coaxial port can pass to said first coaxial port.

7. The splitter according to claim 6, further comprising:
    a second power divider element within said housing, wherein a first terminal of said second power divider element is connected to said second terminal of said first power divider element, a second terminal of said second power divider element is connected to said second coaxial port, and a third terminal of said second power divider element is connected to said fourth coaxial port.

8. The splitter according to claim 7, further comprising: a fifth coaxial port attached to said housing, said fifth coaxial port being connected to said second terminal of said high pass filter.

9. The splitter according to claim 8, further comprising: a third power divider element within said housing, wherein a first terminal of said third power divider element is connected to said second terminal of said high pass filter, a second terminal of said third power divider element is connected to said third coaxial port, and a third terminal of said third power divider element is connected to said fifth coaxial port.

10. The splitter according to claim 9, further comprising: a sixth coaxial port attached to said housing, said sixth coaxial port being connected to said first coaxial port so that all frequencies presented to said first coaxial port can pass to said sixth coaxial port, and so that all frequencies presented to said sixth coaxial port can pass to said first coaxial port, wherein said sixth coaxial port is connected to a fourth terminal of said second power divider element.

11. The splitter according to claim 1, further comprising: a fourth coaxial port attached to said housing, said fourth coaxial port being connected to said second terminal of said high pass filter.

12. The splitter according to claim 11, further comprising: a second power divider element within said housing, wherein a first terminal of said second power divider element is connected to said second terminal of said high pass filter, a second terminal of said second power divider element is connected to said third coaxial port, and a third terminal of said second power divider element is connected to said fourth coaxial port.

13. A splitter comprising:
a housing;
a first coaxial port attached to said housing;
a second coaxial port attached to said housing;
a power divider element within said housing, wherein a first terminal of said power divider element is directly connected to said first coaxial port without any intervening circuit element, and a second terminal of said power divider element is directly connected to said second coaxial port without any intervening circuit element, so that all frequencies presented to said first coaxial port can pass to said second coaxial port, and so that all frequencies presented to said second coaxial port can pass to said first coaxial port;
a high pass filter within said housing, said high pass filter having a first terminal directly connected to a third terminal of said power divider element without any intervening circuit element; and
a third coaxial port attached to said housing, said third coaxial port being directly connected to a second terminal of said high pass filter without any intervening circuit element, so that frequencies within said high pass filter's frequency range may pass from said first coaxial port to said third coaxial port, frequencies within said high pass filter's frequency range may also pass from said third coaxial port to said first coaxial port, and frequencies outside of said high pass filter's frequency range are attenuated by said high pass filter.

14. The splitter according to claim 13, wherein said high pass filter allows frequencies to pass between said second terminal of said power divider element and said third coaxial port which are in a range of 850 MHz to 1675 MHz and attenuates frequencies below the range.

15. The splitter according to claim 13, wherein said high pass filter allows frequencies to pass between said second terminal of said power divider element and said third coaxial port which are in a range of 1125 MHz to 1675 MHz and attenuates frequencies below the range and also attenuates frequencies above the range.

16. A splitter consisting of:
a housing;
a first coaxial port attached to said housing;
a second coaxial port attached to said housing;
a power divider element within said housing, wherein a first terminal of said power divider element is directly connected to said first coaxial port without any intervening circuit element, and a second terminal of said power divider element is directly connected to said second coaxial port without any intervening circuit element, so that all frequencies presented to said first coaxial port can pass to said second coaxial port, and so that all frequencies presented to said second coaxial port can pass to said first coaxial port;
a high pass filter within said housing, said high pass filter having a first terminal directly connected to a third terminal of said power divider element without any intervening circuit element; and
a third coaxial port attached to said housing, said third coaxial port being directly connected to a second terminal of said high pass filter without any intervening circuit element, so that frequencies within said high pass filter's frequency range may pass from said first coaxial port to said third coaxial port, frequencies within said high pass filter's frequency range may also pass from said third coaxial port to said first coaxial port, and frequencies outside of said high pass filter's frequency range are attenuated by said high pass filter.

17. The splitter according to claim 16, wherein said high pass filter passes frequencies in the MoCA range and attenuates frequencies below the MoCA range.

18. The splitter according to claim 16, wherein said high pass filter passes frequencies in the 1,125 MHz to 1,675 MHz range and attenuates frequencies below about 1,125 MHz.

19. The splitter according to claim 16, wherein said high pass filter allows frequencies to pass between said second terminal of said power divider element and said third coaxial port which are in a range of 850 MHz to 1675 MHz and attenuates frequencies below the range.

20. The splitter according to claim 16, wherein said high pass filter allows frequencies to pass between said second terminal of said power divider element and said third coaxial port which are in a range of 1125 MHz to 1675 MHz and attenuates frequencies below the range and also attenuates frequencies above the range.

* * * * *